(12) United States Patent
Park

(10) Patent No.: US 8,592,246 B2
(45) Date of Patent: Nov. 26, 2013

(54) METHODS OF MANUFACTURING A SOLAR CELL MODULE

(75) Inventor: Rae-Man Park, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 0 days.

(21) Appl. No.: 13/474,783

(22) Filed: May 18, 2012

(65) Prior Publication Data

US 2012/0315721 A1 Dec. 13, 2012

(30) Foreign Application Priority Data

Jun. 7, 2011 (KR) ............... 10-2011-0054764
Sep. 30, 2011 (KR) ............... 10-2011-0099841

(51) Int. Cl.
*H01L 21/00* (2006.01)
(52) U.S. Cl.
USPC ............. 438/86; 438/82; 438/99; 438/609; 257/40; 257/E21.254; 977/755; 977/762

(58) Field of Classification Search
USPC ............. 438/98–99, 82, 609, 343; 257/40, 257/E21.254; 977/755, 762
See application file for complete search history.

(56) References Cited

U.S. PATENT DOCUMENTS

| | | | |
|---|---|---|---|
| 8,354,296 B2 * | 1/2013 | Dimitrakopoulos et al. | ... 438/99 |
| 2010/0294350 A1 | 11/2010 | Ko et al. | |
| 2011/0108099 A1 * | 5/2011 | Pinarbasi et al. | ............. 136/255 |
| 2013/0008496 A1 * | 1/2013 | Jee | ................... 136/256 |

FOREIGN PATENT DOCUMENTS

KR  10-1061970 B1  8/2011

* cited by examiner

*Primary Examiner* — Mark A Laurenzi
(74) *Attorney, Agent, or Firm* — Rabin & Berdo, P.C.

(57) ABSTRACT

Methods of manufacturing a solar cell module are provided. The method may include forming lower electrodes on a substrate, forming a light absorption layer on the lower electrodes and the substrate, patterning the light absorption layer to form a trench exposing the lower electrodes, and forming window electrodes using a conductive film. The conductive film extends from a top surface of the light absorption layer to a bottom of the trench along one-sidewall of the trench and is divided at another-sidewall of the trench.

15 Claims, 9 Drawing Sheets

METHODS OF MANUFACTURING A SOLAR CELL MODULE

CROSS-REFERENCE TO RELATED APPLICATIONS

This U.S. non-provisional patent application claims priority under 35 U.S.C. §119 to Korean Patent Application Nos. 10-2011-0054764 and 10-2011-0099841, filed on Jun. 7, 2011 and Sep. 30, 2011, the entirety of which is incorporated by reference herein.

BACKGROUND

The inventive concept relates to methods of manufacturing a solar cell module.

Copper-indium-gallium-selenium (CIGS) thin film solar cells may be higher in efficiency than amorphous silicon solar cells. Additionally, an initial deterioration phenomenon may not occur in the CIGS thin film solar cells, such that these may have a relatively high stability. Thus, various techniques have been developed for commercialization of the CIGS thin film solar cells. The CIGS thin film solar cells may be replaced with single-crystal solar cells because of lightness and high efficiency thereof. The CIGS thin film solar cells may be capable of being used in space. The CIGS thin film solar cells may have the electricity generation amount per unit weight of about 100 W/kg. Thus, the CIGS thin film solar cells may have more excellent efficiency than silicon or GaAs solar cells having the electricity generation amount per unit weight of about 20 W/kg to about 40 W/kg. Currently, the CIGS thin film solar cells may have the efficiency of about 20.3% in a single junction structure. Thus, the CIGS thin film solar cells may have a capacity substantially equal to the maximum efficiency (e.g., about 20%) of an existing poly-crystalline silicon solar cells.

In spite of the above advantages, the CIGS thin film solar cells may have low productivity. Since CIGS thin film solar cell modules may be generally formed through various steps of vacuum processes, the CIGS thin film solar cell modules may have high manufacture cost and low mass productivity. The CIGS thin film solar cell module may include a lower electrode, a light absorption layer, and a window electrode that are sequentially stacked on a substrate. The window electrode may include a transparent electrode layer having a thickness of several micrometers to several tens micrometers. The transparent electrode layer may be formed by a sputtering method.

However, when the transparent electrode layer having the thickness of several micrometers or more is deposited by the sputtering method, the time required for the deposition process may increase. Thus, the productivity of solar cell modules may be decrease. Additionally, the long times of the deposition process may cause an increase of manufacture cost of the solar cell modules.

SUMMARY

Embodiments of the inventive concept may provide methods of manufacturing a solar cell module capable of increasing or maximizing productivity.

According to embodiments of the inventive concepts, a method of manufacturing a solar cell module may include: forming lower electrodes on a substrate; forming a light absorption layer on the lower electrodes and the substrate; patterning the light absorption layer to form a trench exposing the lower electrodes; and forming window electrodes using a conductive film, the conductive film extending from a top surface of the light absorption layer to a bottom of the trench along one-sidewall of the trench, and the conductive film divided at another-sidewall of the trench.

In some embodiments, the conductive film may be roll-printed or taped.

In other embodiments, the conductive film may include zinc oxide (ZnO).

In still other embodiments, the conductive film further may include at least one conductive impurity.

In yet other embodiments, the conductive film may include graphene.

In yet still other embodiments, forming the window electrodes may include: roll-printing or taping the conductive film on the lower electrodes of the bottom of the trench and the light absorption layer; and scribing the conductive film on the another-sidewall of the trench.

In yet still other embodiments, the method may further include: forming a first buffer layer on the light absorption layer.

In yet still other embodiments, the first buffer layer may include cadmium sulfide (CdS).

In yet still other embodiments, the method may further include: forming a second buffer layer on the first buffer layer.

In yet still other embodiments, the second buffer layer may include intrinsic zinc oxide.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
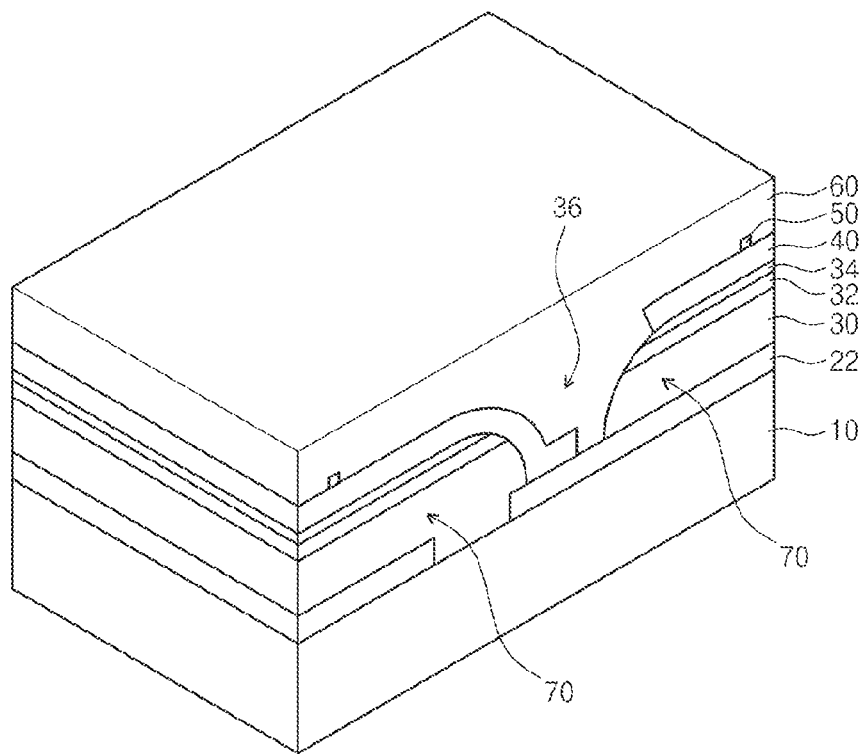
FIG. 1 is a perspective view illustrating a solar cell module according to embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a perspective view illustrating a solar cell module according to embodiments of the inventive concept.

Referring to FIG. 1, according to embodiments of the inventive concept, a solar cell module may include a window electrodes 40 extending from a top surface of a light absorption layer 30 onto a bottom of a trench 36 outside the light absorption 30. The window electrodes 40 may include a conductive film having a thickness of a range of about 2 μm to about 3 μm. The window electrodes 40 may cover the light absorption layer 30 and first and second buffer layers 32 and 34 at one-sidewall of the trench 36, and the window electrodes 40 may expose the light absorption layer 30 and the first and second buffer layers 32 and 34 at another-sidewall of the trench 36. A grid 50 may be disposed on the window electrodes 40. An encapsulation layer 60 may cover the grid 50, the window electrodes 40, and the trench 36.

Each of unit cells 70 may consist of a lower electrode 22, the light absorption layer 30, the first buffer layer 32, the second buffer layer 34, and the window electrode 40. The unit cells 70 adjacent to each other may be separated from each other by the trench 36. In other words, the trench 36 may define the unit cells 70. The window electrode 40 of one unit cell 70 may be connected to the lower electrode 22 of another unit cell 70 adjacent to the one unit cell 70.

In each of the unit cells 70, the window electrode 40 may be spaced apart from the lower electrode 22 by the light absorption layer 30, the first buffer layer 32, and the second buffer layer 34. The window electrodes 40 and the lower electrodes 22 may connect the unit cells 70 adjacent to each other.

A method of manufacturing the solar cell module described above will be described hereinafter.

FIGS. 2 to 9 are perspective views illustrating a method of manufacturing a solar cell module according to embodiments of the inventive concept.

Figure 2:
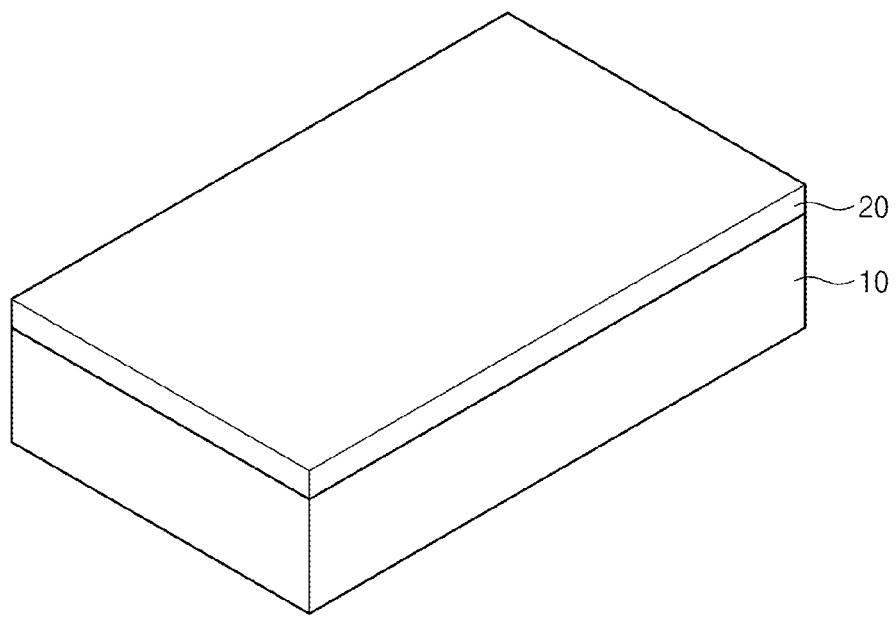
FIGS. 2 to 9 are perspective views illustrating a method of manufacturing a solar cell module according to embodiments of the inventive concept.

Referring to FIG. 2, a conductive metal layer 20 may be formed on a substrate 10. The substrate 10 may be a sodalime glass substrate. Alternatively, the substrate 10 may be a ceramic substrate such as alumina, a metal substrate such as a stainless steel plate or a copper tape, or a polymer film. The conductive metal layer 20 may have a low resistivity. Additionally, the conductive metal layer 20 may have an excellent adhesion in order to prevent or minimize a lift-off phenomenon caused by difference between thermal expansivities. In more detail, the conductive metal layer 20 may include molybdenum. The molybdenum may have high electrical conduction and an ohmic contact formation characteristic for another thin film. Additionally, the molybdenum may have high stability at a high temperature under selenium (Se) atmosphere.

Figure 3:
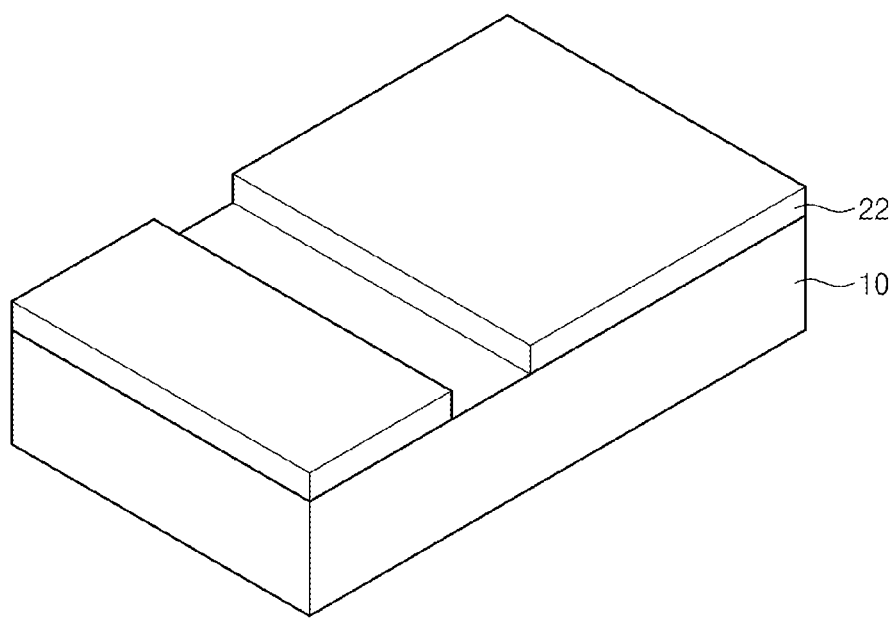

Referring to FIG. 3, the conductive metal layer 20 may be patterned to form lower electrodes 22. The lower electrodes 22 may be formed by a laser beam or a photolithography process.

Figure 4:
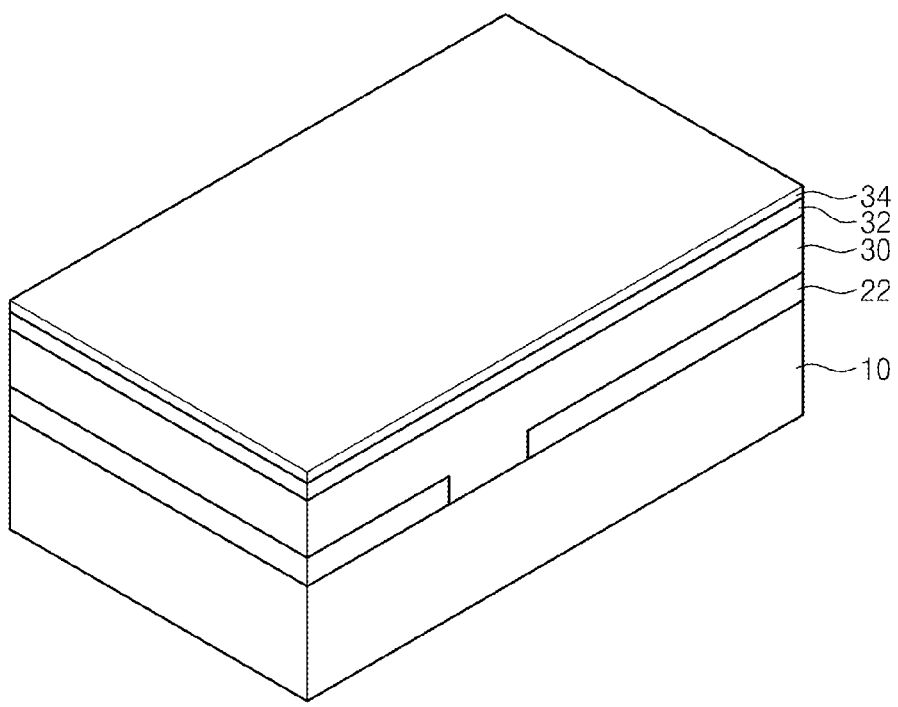

Referring to FIGS. 1 and 4, a light absorption layer 30, a first buffer layer 32, and a second buffer layer 34 may be sequentially stacked on the lower electrodes 22. The light absorption layer 30 may generate an electrical energy from a light energy by photoelectric effect. The light absorption layer 30 may include a chalcopyrite-based compound semiconductor including at least one of CuInSe, $CuInSe_2$, CuInGaSe, and $CuInGaSe_2$. The chalcopyrite-based compound semiconductor may have an energy band gap of about 1.2 eV.

The first buffer layer 32 may buffer energy band gaps of a window electrode 40 formed by a subsequent process and the light absorption layer 30. The first buffer layer 32 may have an energy band gap greater than that of the light absorption layer 30 and smaller than that of the window electrode 40. For example, the buffer layer 32 may include cadmium sulfide (CdS). The cadmium sulfide may have a substantially uniform energy band gap of about 2.4 eV.

Since a lattice constant of the light absorption layer 30 is different from that of the window electrode 40, the second buffer layer 34 may be provided for a good joining of the light absorption layer 30 and the window electrode 40. The second buffer layer 34 may include intrinsic zinc oxide (i-ZnO). The second buffer layer 34 may have the same crystal structure as the window electrode 40. For example, the second buffer layer 34 and the window electrode 40 may have a wurtzite crystal structure.

Figure 5:
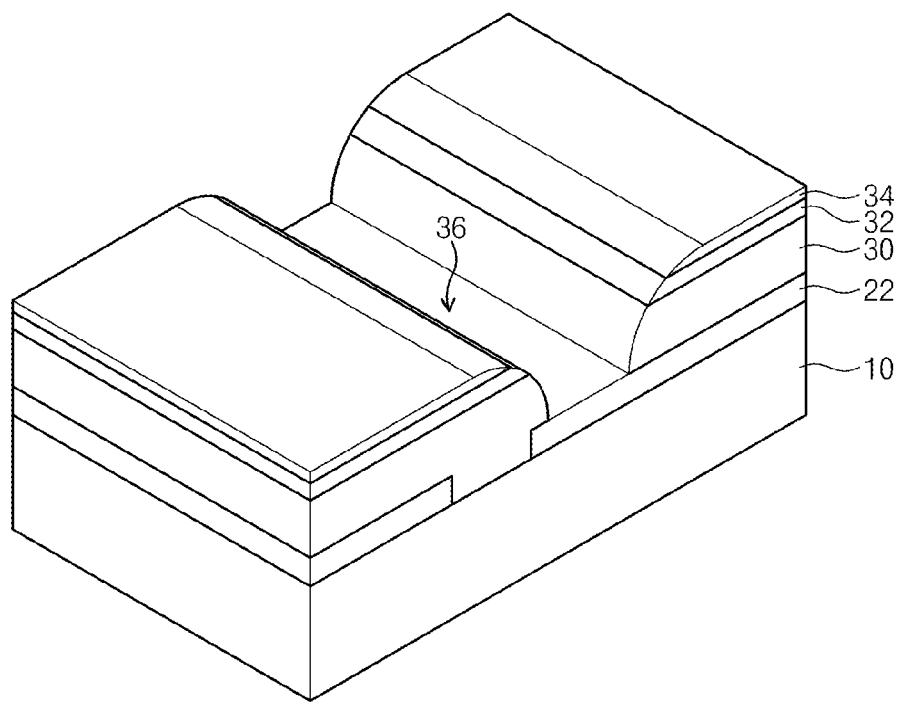

Referring to FIG. 5, the second buffer layer 34, the first buffer layer 32, and the light absorption layer 30 may be patterned to form a trench 36. The trench 36 may be formed by a mechanical scribing performed on the second buffer layer 34, the first buffer layer 32, and the light absorption layer 30. The trench 36 may expose the lower electrodes 22.

Figure 6:
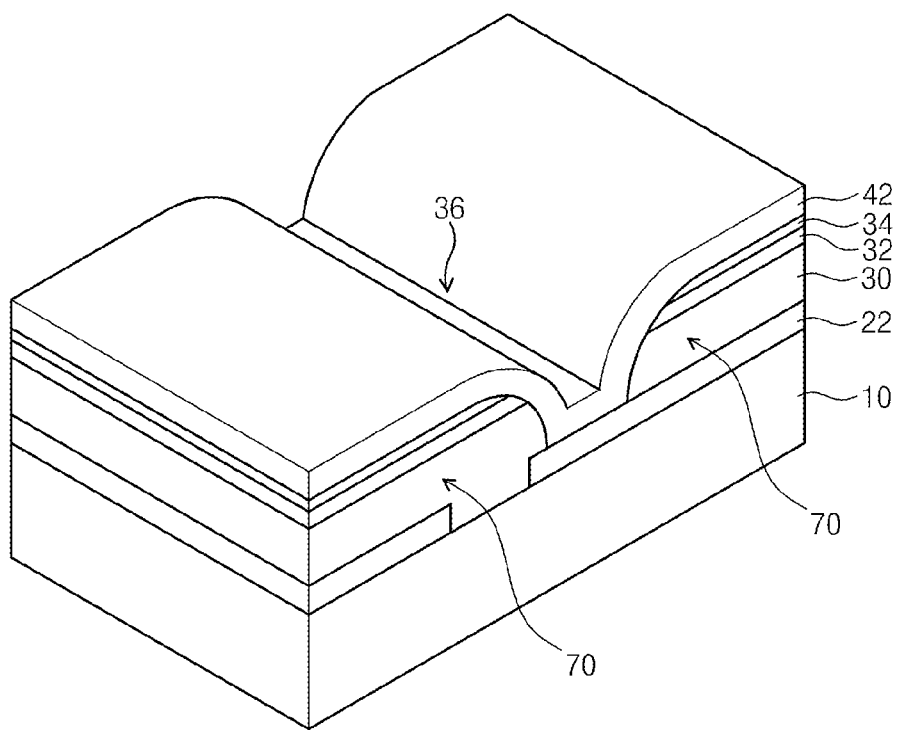

Referring to FIG. 6, a conductive film 42 is formed on the second buffer layer 34 and the lower electrode 22. The conductive film 42 may be roll-printed or taped on the second buffer layer 34 and the lower electrode 22. The conductive film 42 has a thickness having a range of about 2 µm to about 3 µm. The conductive film 42 may include zinc oxide (ZnO) doped with impurities such as boron (B), gallium (Ga), aluminum (Al), magnesium (Mg), indium (In), tin (Sn), and/or fluorine (F). The conductive film 42 may be bonded to the second buffer layer 34 and the lower electrodes 22 of a bottom of the trench 36. The conductive film 42 may be pressed by a roller (not shown). The pressing bond may reduce manufacturing time and cost as compared with a conventional sputtering method. Additionally, the conductive film 42 may include graphene. The graphene may be formed on the second buffer layer 34 and the lower electrodes 22 of the bottom of trench 36 by a transferring method.

Thus, the method of manufacturing the solar cell module according to embodiments of the inventive concept may increase or maximize productivity.

Even though not shown in the drawings, the conductive film 42 may include zinc oxide (ZnO) doped with impurities and intrinsic zinc oxide (i-ZnO). When the conductive film 42 consisting (ZnO) doped with impurities and intrinsic zinc oxide (i-ZnO) is used, the process forming the second buffer layer 34 may be omitted. For example, the light absorption layer 30 and the first buffer layer 32 may be stacked on the lower electrodes 22. Thereafter, portions of the first buffer layer 32 and the light absorption layer 30 may be removed to form a trench 36. Next, the conductive film 42 may be roll-printed or taped on the first buffer layer 32 and the lower electrodes 22 of the bottom of the trench 36. The conductive film 42 may be bonded to the lower electrodes 22 and the first buffer layer 32.

Figure 7:
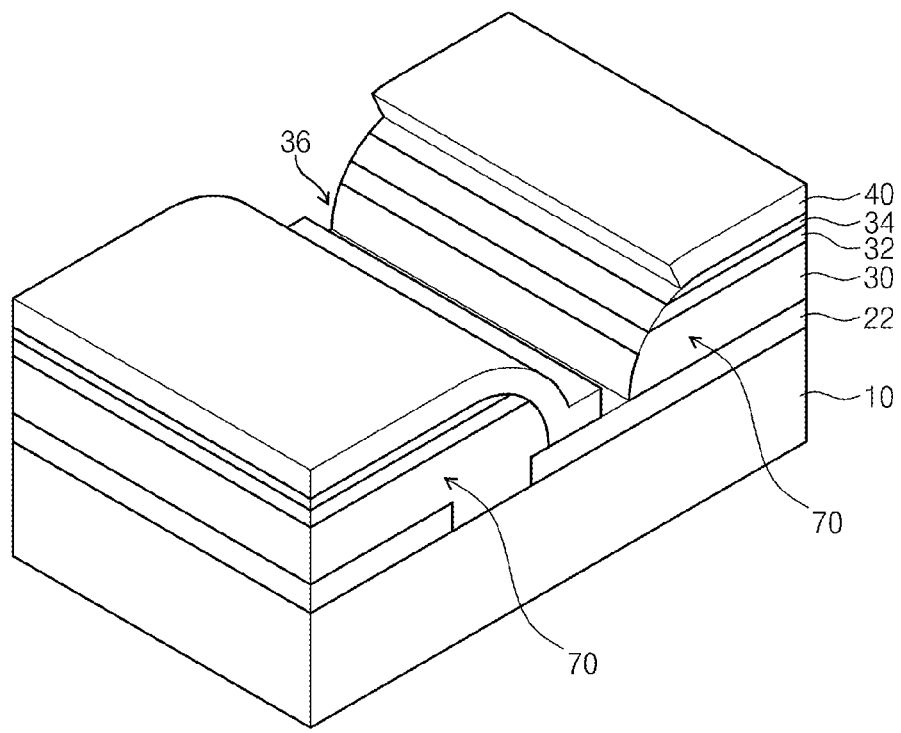

Referring to FIG. 7, a portion of the conductive film 42 on another-sidewall of the trench 36 may be removed to form window electrodes 40. The portion of the conductive film 42 may be removed from the another-sidewall of the trench 36 by a scribing process using a laser beam or a knife. The conductive film 42 on one-sidewall of the trench 36 may remain. In other words, one-sides of the window electrodes 40 may be electrically connected to the lower electrodes 22. Another-sides of the window electrodes 40 may be separated from the lower electrodes 22. In one unit cell 70, the window electrode 40 and the lower electrode 22 may be vertically spaced apart from each other by the light absorption layer 30, the first buffer layer 32, and the second buffer layer 34. The unit cells 70 adjacent to each other may be connected in series. The portion of the conductive film 42 may be removed by a mechanical scribing method cheaper than the photolithography process and/or a laser beam etching process. Each of the unit cells 70 may include the lower electrode 22, the light absorption layer 30, the first buffer layer 32, the second buffer layer 34, and the window electrode 40 which are stacked. The unit cells 70 may be defined by the trench 36. The window electrode 40 of one unit cell 70 may be connected to the lower electrode 22 of another unit cell 70 adjacent to the one unit cell 70.

Meanwhile, after a portion of the conductive film 42 is removed from a roll or a tape corresponding to the another-sidewall of the trench 36, the conductive film 42 may be roll-printed or taped over the substrate 10. In this case, when the conductive film 42 is roll-printed or taped, the conductive film 42 may extend from a top surface of the second buffer layer 34 to the bottom of the trench 36 along the one-sidewall of the trench 36 may be divided at the another-sidewall of the trench 36. At this time, the scribing process may be omitted.

Thus, the method of manufacturing the solar cell module according to embodiments of the inventive concept may increase or maximize productivity.

Figure 8:
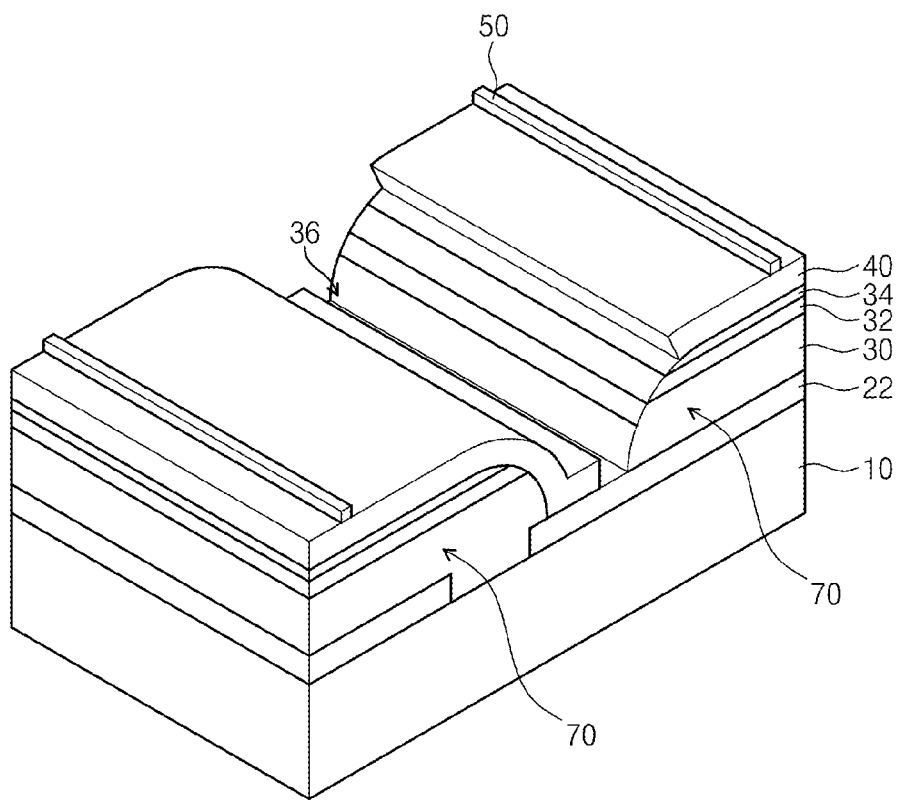

Referring to FIG. 8, a grid 50 is formed on the window electrodes 40. The grid 50 may be electrically connected to the window electrodes 40. Even though not shown in the drawings, the grid 50 may have a mesh-shape.

Figure 9:
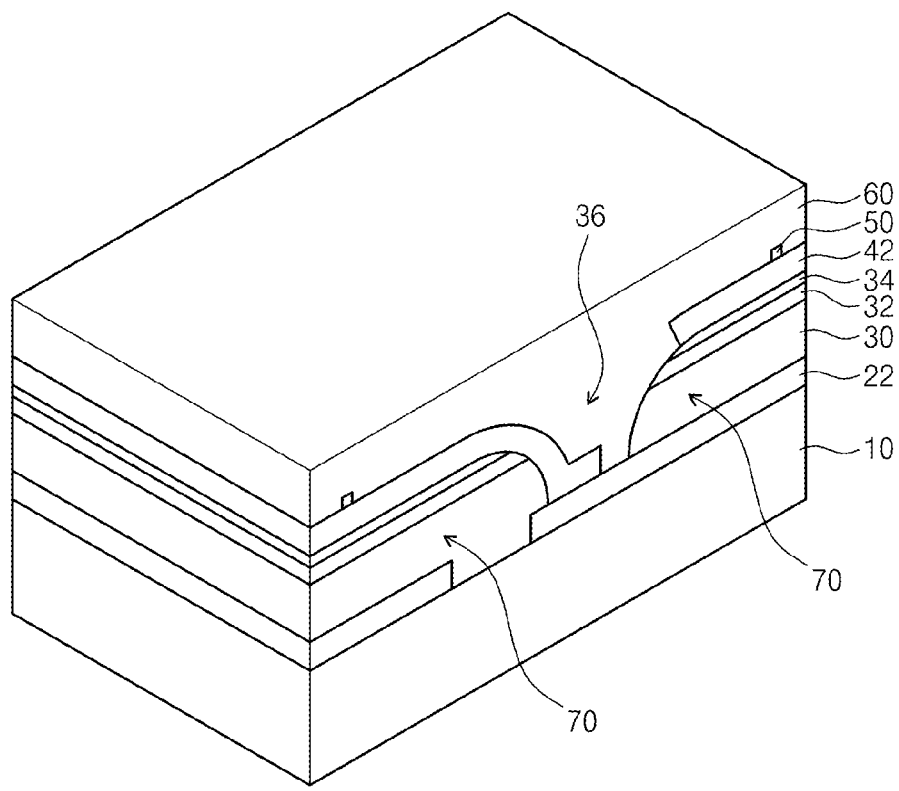

Referring to FIG. 9, an encapsulation layer 60 is formed on the grid 50 and the window electrode 40. The encapsulation layer 60 may include a glass or a film covering the window electrodes 40 and the grid 50.

As a result, since the window electrodes 40 are formed using the roll-printed or taped the conductive film 42 in the method of manufacturing the solar cell module according to embodiments of the inventive concept, productivity may be increased or maximized.

According to embodiments of the inventive concept, the window electrode transmitting light into the light absorption layer are formed by the roll-printed or taped conductive film. The bonding of the conductive film may reduce a process time as compared with the conventional sputtering method.

Thus, the method of manufacturing the solar cell module according to embodiments of the inventive concept may increase or maximize productivity.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of manufacturing a solar cell module, comprising:
    forming lower electrodes, including a first lower electrode and a second lower electrode, on a substrate;
    forming a light absorption layer on the lower electrodes and the substrate;
    patterning the light absorption layer to form only a single trench exposing the lower electrodes; and
    forming window electrodes, including a first window electrode and a second window electrode, from a conductive film, the first window electrode extending from a top surface of the light absorption layer to a bottom of the single trench along one-sidewall of the single trench, the first window electrode contacting in the single trench one of the first lower electrode and the second lower electrode, and the second window electrode being separate from the first window electrode and being disposed on another-sidewall of the single trench,
    wherein the single trench is disposed between the first window electrode and the second window electrode.

2. The method of claim 1, further comprising roll-printing or taping the conductive film.

3. The method of claim 2, wherein the conductive film includes zinc oxide.

4. The method of claim 3, wherein the conductive film further includes at least one conductive impurity.

5. The method of claim 2, wherein the conductive film includes graphene.

6. The method of claim 2, wherein forming the window electrodes comprises:

roll-printing or taping the conductive film on both a part of the lower electrodes that is disposed at of a bottom of the single trench, and the light absorption layer; and scribing the conductive film to form the second window electrode.

7. The method of claim 1, further comprising:
forming a first buffer layer on the light absorption layer.

8. The method of claim 7, wherein the first buffer layer includes cadmium sulfide.

9. The method of claim 7, further comprising:
forming a second buffer layer on the first buffer layer.

10. The method of claim 9, wherein the second buffer layer includes intrinsic zinc oxide.

11. The method of claim 1, wherein in the step of forming window electrodes, the first window electrode is formed so that the first window electrode covers a part of the bottom of the single trench while leaving another part of the bottom of the single trench uncovered.

12. The method of claim 1, wherein in the step of forming window electrodes, the first and second window electrodes are formed so that the first and second window electrodes do not touch each other.

13. The method of claim 1, wherein in the step of forming window electrodes, the first and second window electrodes are formed so that only an aperture is disposed between the first window electrode and the another-sidewall.

14. The method of claim 1, wherein the bottom of the single trench touches both a lowermost part of the one-sidewall and a lowermost part of the another-sidewall, the entire bottom being completely disposed beneath the entire one-sidewall and the entire another side wall.

15. A method of manufacturing a solar cell module, comprising:

forming lower electrodes on a substrate;

forming a light absorption layer on the lower electrodes and the substrate;

patterning the light absorption layer to form only a single trench exposing the lower electrodes; and forming first and second window electrodes from a conductive film, the first window electrode extending from a top surface of the light absorption layer to a bottom of the single trench along one-sidewall of the single trench, and the second window electrode being separate from the first window electrode and being disposed on another-sidewall of the single trench.

* * * * *